United States Patent [19]

Oyama

[11] Patent Number: 5,543,763
[45] Date of Patent: Aug. 6, 1996

[54] PIEZOELECTRIC COMPONENT FOR LADDER TYPE FILTER AND METHOD OF MANUFACTURING THEREOF

[75] Inventor: Yuusei Oyama, Nagaokakyo, Japan

[73] Assignee: Murata Manufacturing Co., Ltd., Japan

[21] Appl. No.: 370,541

[22] Filed: Jan. 9, 1995

Related U.S. Application Data

[63] Continuation of Ser. No. 116,380, Sep. 3, 1993, abandoned.

[30] Foreign Application Priority Data

Sep. 7, 1992 [JP] Japan ................................ 4-265442

[51] Int. Cl.⁶ ....................................... H03H 9/00
[52] U.S. Cl. ................ 333/189; 333/190; 333/191; 310/355; 29/25.35
[58] Field of Search ........................ 333/187, 188, 333/189, 190, 191, 192; 310/348, 355; 29/25.35

[56] References Cited

U.S. PATENT DOCUMENTS

| 4,308,482 | 12/1981 | Kadohashi | 310/354 |
| 4,353,045 | 10/1982 | Matsui et al. | 333/190 |
| 4,656,385 | 4/1987 | Tanaka | 310/348 |
| 4,864,259 | 9/1989 | Takamoro et al. | 333/189 |

FOREIGN PATENT DOCUMENTS

| 0062416 | 5/1981 | Japan | 333/191 |
| 0210713 | 11/1984 | Japan | 333/189 |
| 0004314 | 1/1986 | Japan | 333/189 |
| 0157414 | 7/1987 | Japan | 333/189 |
| 0210905 | 8/1990 | Japan | 333/189 |
| 4252607 | 9/1992 | Japan | 333/190 |

*Primary Examiner*—Benny Lee
*Assistant Examiner*—Darius Gambino
*Attorney, Agent, or Firm*—Ostrolenk, Faber, Gerb & Soffen, LLP

[57] ABSTRACT

A piezoelectric component includes an input terminal plate, a series ceramic resonator, an output terminal plate, a parallel ceramic resonator and a ground terminal plate stacked between a first case and a second case. Lead portions of the input terminal plate, the output terminal plate and the ground terminal plate are outwardly projected from the cases. These terminal plates and the ceramic resonators are in pressure contact with each other to attain electrical conduction therebetween and thus, form a single-section ladder type filter.

11 Claims, 8 Drawing Sheets

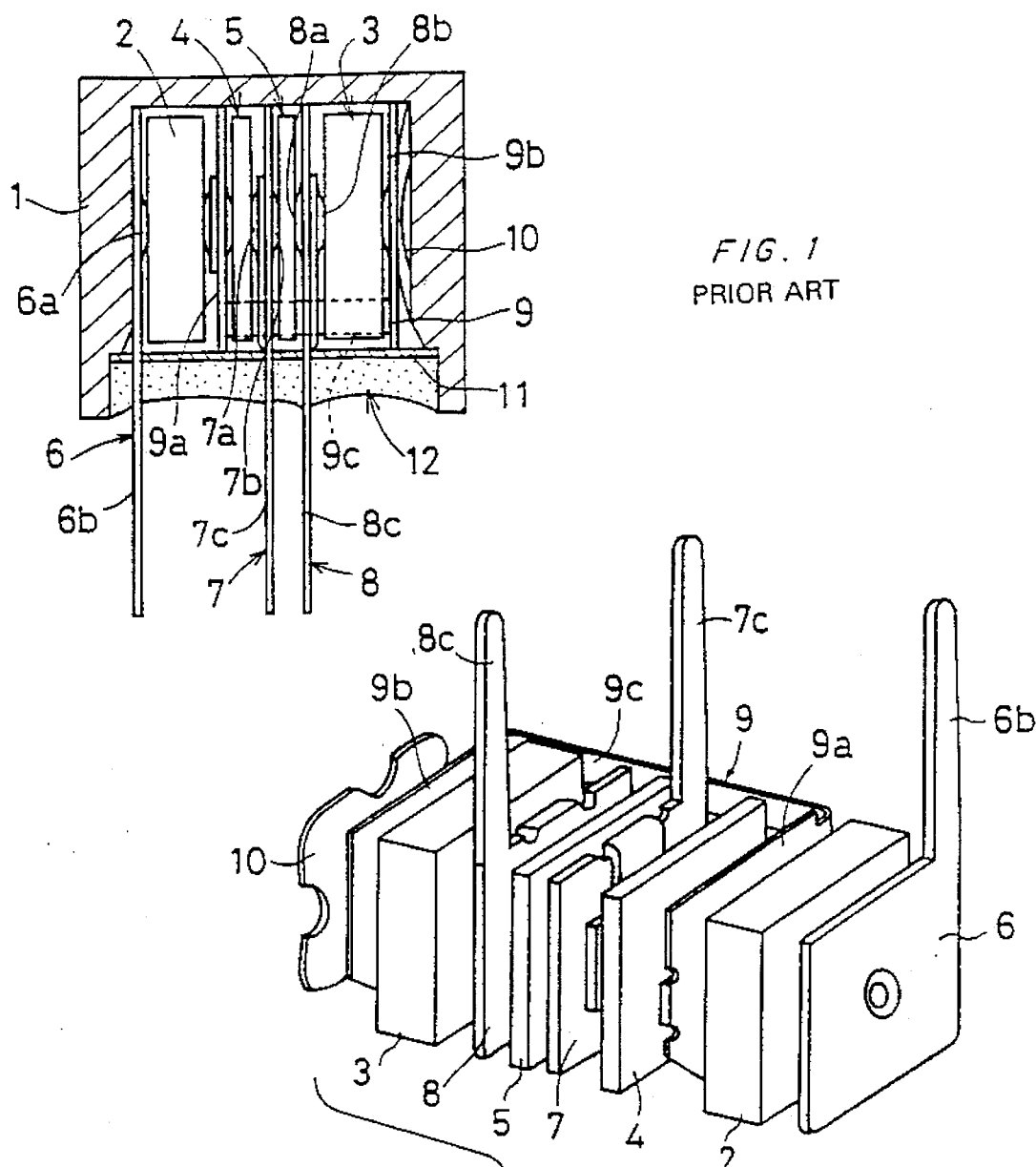
FIG. 1
PRIOR ART
FIG. 2
PRIOR ART
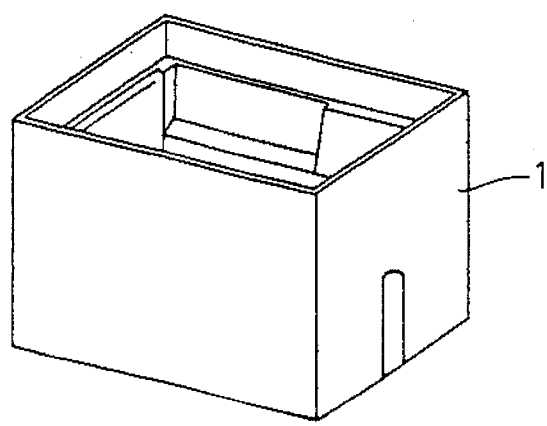

PIEZOELECTRIC COMPONENT FOR LADDER TYPE FILTER AND METHOD OF MANUFACTURING THEREOF

This is a Continuation of application Ser. No. 08/116,380 filed on Sep. 3, 1993, now abandoned.

BACKGROUND OF THE INVENTION

The present invention relates to a piezoelectric component for obtaining a filter comprising series and parallel resonators which are connected to each other in the form of a ladder, and a method of manufacturing thereof.

A ladder type filter is widely applied to an IF filter for a portable radio communication device or a taxi radio communication device. FIGS. 1 and 2 show an example of a conventional four-element (two-section) ladder type filter. This filter comprises a box case 1 which stores two series ceramic resonators 2 and 3, two parallel ceramic resonators 4 and 5, an input terminal plate 6, a ground terminal plate 7, an output terminal plate 8, a connecting terminal plate 9 and a spring plate 10. FIG. 3 shows its electrical connection.

The input terminal plate 6 is provided on its one surface with a projection 6a which comes into pressure contact with a central portion of the series resonator 2. The ground terminal plate 7 is provided on its both surfaces with projections 7a and 7b which come into pressure contact with central portions of the two parallel resonators 4 and 5. The output terminal plate 8 is provided on its both surfaces with projections 8a and 8b which come into pressure contact with central portions of the parallel resonator 5 and the series resonator 3, respectively. The connecting terminal plate 9 has a portion 9a which is inserted between the series resonator 2 and the parallel resonator 4 and another portion 9b which is arranged outside of the series resonator 3. These portions 9a and 9b are coupled with each other by a coupling portion 9c. The spring plate 10 is arranged between the portion 9b and an interior surface of the case 1, to bring the terminal plates 6–9 into pressure contact with the resonators 2–5, thereby electrically connecting all of the parts 2–9.

After the resonators 2–5, the terminal plates 6–9 and the spring plate 10 are inserted into the case 1 in the aforementioned manner, a stopper sheet 11 having slits is set into an opening of the case 1. Then a cavity defined by the sheet 11 and the opening is filled up with resin 12 so that the case 1 is sealed. Respective lead portions 6b, 7c and 8c of the terminal plates 6, 7 and 8 are projected from the case 1.

When the aforementioned parts are assembled into the filter, the resonators 2–5 are brought into contact with the terminal plates 6–9 in such instable states that it is impossible to simultaneously insert a plurality of such resonators or terminal plates into the case 1. In general, therefore, such parts are manually inserted one by one into the case 1. Consequently, a long time is required for assembling those parts and working efficiency is lowered. When the aforementioned filter is automatically assembled by a robot or the like, the operating speed thereof cannot be increased since it is necessary to align the parts one by one along the thickness direction. Further, it is difficult to accurately locate the respective parts, and hence the conventional filter is unsuitable for automatic assembling.

Further, a ladder type filter with four or more elements increases the manufacturing cost since parts having complicated shapes such as the connecting terminal plate 9 are required. Moreover, a difficult operation is required for simultaneously inserting such parts into a plurality of gaps between other parts.

In addition, in a resin-molded ladder type filter, it is necessary to set a stopper sheet in an opening of a case in order to prevent resin from flowing into the case. This also may reduce working efficiency.

SUMMARY OF THE INVENTION

Accordingly, an object of the present invention is to provide a piezoelectric component for a ladder type filter which can be easily manufactured by automatic assembling.

Another object of the present invention is to provide a method of manufacturing a piezoelectric component for a ladder type filter easily and at a low cost.

In the piezoelectric component for a ladder type filter according to the present invention, an input terminal plate, a series ceramic resonator, an output terminal plate, a parallel ceramic resonator and a ground terminal plate are held between first and second cases. The first case such is covered by the second case that the terminal plates and the ceramic resonators are brought into pressure contact to be electrically connected with each other. Lead portions of the terminal plates are outwardly projected from the first and the second cases, so that the lead portions can be connected to an external circuit.

The input terminal plate, the series resonator, the output terminal plate, the parallel resonator and the ground terminal plate which are in pressure contact with each other are formed into a ladder circuit of a single-section. When a plurality of such ladder circuits are arranged side by side, a piezoelectric component having an arbitrary number of sections can be obtained. In the component having plural sections according to the present invention, a ladder type filter is not yet completed at this stage since the as-formed ladder circuits are still separated in sections. In order to complete the ladder type filter, therefore, the input terminal plate of one section and the output terminal plate of another section may be connected. When such a piezoelectric component is mounted on a printed board, the lead portions of the input and output terminal plates can be connected through printed wires of the printed board, so that the ladder type filter can be completed. Moreover, when external capacitors, external resistors or switches are connected to the lead portions, it is possible to change filter characteristics.

According to the present invention, it is possible to assemble the piezoelectric component by successively stacking the input terminal plate, the series resonator, the output terminal plate, the parallel resonator, the ground terminal plate and the second case on the first case. Thus, it is easy for the piezoelectric component of the present invention to be automatically assembled in contrast to the conventional one which is manually assembled by inserting terminal plates and resonators one by one into a box case. Further, even if the piezoelectric component is a multi-element type having four or more elements, only three types of the terminal plates are required in the present invention. Thus terminal plates having complicated shapes or an insulating plate is no longer required unlike the conventional ladder type filter of a multi-element type. As a result, it is possible to reduce the manufacturing cost.

In the present invention, it is preferable to form a terminal plate coupled with a strip portion from a metal plate, so that the strip portion is cut off after the terminal plate is arranged between the first and the second cases. In the case of multi-element type component, since a plurality of the same type terminal plates are coupled with the strip portion with high positional accuracy, an additional step for accurate location is not required even if the number of the terminal plates is increased. Further, the terminal plates coupled with the strip portion are prevented from inclination in stacking, whereby the piezoelectric component of the present invention is improved in assembling efficiency.

In the piezoelectric component according to the present invention, by making at least one of the input terminal plate, the output terminal plate and the ground terminal plate out of a spring plate or by adding a spring plate or a rubber plate independently of those terminal plates, it is possible to bring the terminal plates into pressure contact with the resonators, thereby attaining reliable electrical conduction.

It is also possible to readily obtain a sealed piezoelectric component by sealing a gap between the first and the second cases using a method such as ultrasonic welding, or by inserting the first and the second cases into a box type outer case and filling an opening of the outer case with resin. In these cases, no stopper sheet is required for preventing the resin from flowing into the interior of the component.

Moreover, according to the present invention, it is easy to obtain an SIP type piezoelectric component by cranking the lead portions in the cases.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal sectional view showing a conventional ladder type filter;

FIG. 2 is an exploded perspective view of the filter shown in FIG. 1;

DESCRIPTION OF THE PREFERRED EMBODIMENTS

FIGS. 4 to 7 show a piezoelectric component for a four-element ladder type filter according to a first embodiment of the present invention.

Figure 7:
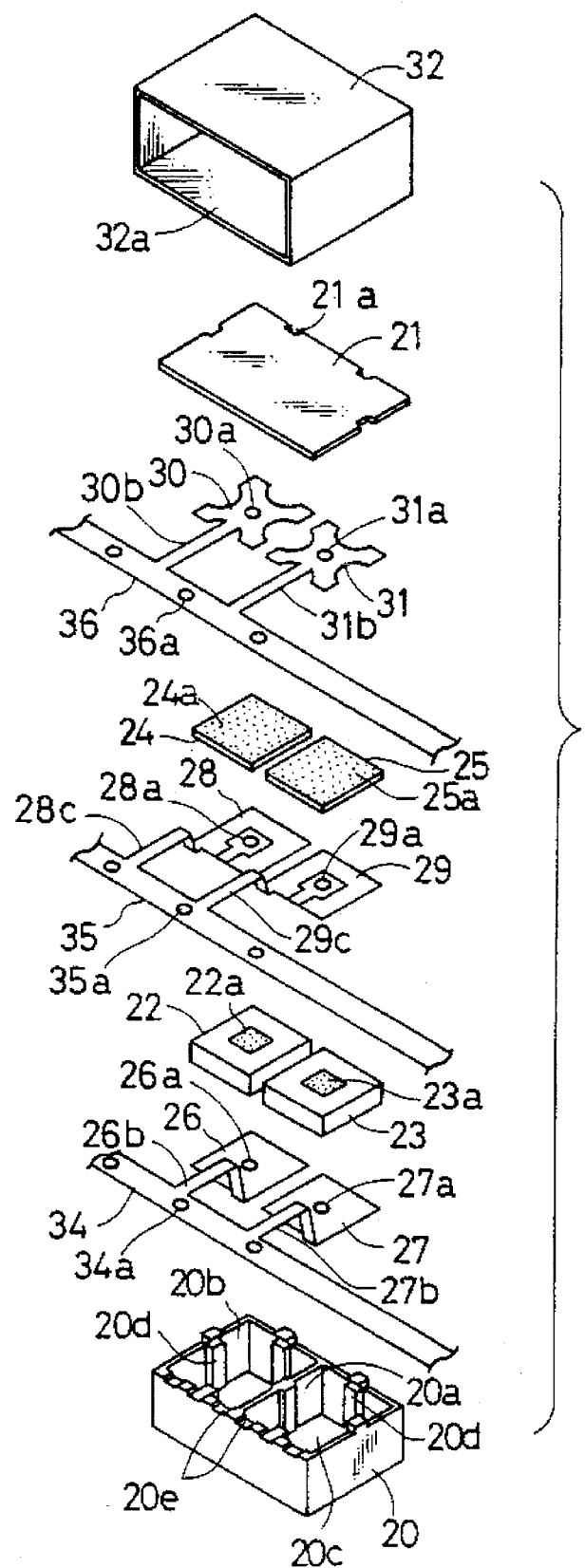
FIG. 7 is an exploded perspective view of the piezoelectric component shown in FIG. 4.

As shown in FIG. 7, this piezoelectric component is formed by first and second cases 20 and 21 made of resin, two series ceramic resonators 22 and 23, two parallel ceramic resonators 24 and 25, two input terminal plates 26 and 27, two output terminal plates 28 and 29, two ground terminal plates 30 and 31, and a box type outer case 32 made of resin or metal.

The first case 20 is a container which has a opening at its upper surface, and its interior is divided into two spaces 20b and 20c by a partition 20a. Four pillars 20d are formed at the interior of each of the spaces 20b and 20c in order to locate outer peripheries of the resonators 22–25 and the terminal plates 26–31. The first case 20 is provided on an upper surface of its one side wall with a plurality of grooves 20e for drawing out the lead portions of the terminals. On the other hand, the second case 21, which is a flat cover plate for closing the opening of the first case 20, is provided on its three edges with recesses 21a to be engaged with hooks 20f formed on the upper ends of the pillars 20d.

The input terminal plates 26 and 27, being arranged side by side, are placed on a bottom of the first case 20. Projections 26a and 27a are provided on upper surfaces of central portions of these terminals 26 and 27, while cranked lead portions 26b and 27b are projected in parallel with each other from side edges thereof. The lead portions 26b and 27b are located to be engaged with the grooves 20e of the first case 20 and then drawn outside.

The series resonators 22 and 23 are placed on the input terminal plates 26 and 27 respectively. These resonators 22 and 23, which are piezoelectric ceramic resonators utilizing spread vibration modes, for example, are provided on upper and lower surfaces of central portions thereof with partial electrodes 22a and 23a. The electrodes 22a and 23a on the lower surfaces of these resonators 22 and 23 come into contact with the projections 26a and 27a of the input terminal plates 26 and 27.

The output terminal plates 28 and 29 are placed on the series resonators 22 and 23 respectively. Projections 28a, 28b, 29a and 29b (28b and 29b not shown) are provided on upper and lower surfaces of central portions of the output terminals 28 and 29, so that the lower projections 28b and 29b are in contact with the electrodes 22a and 23a on the upper surfaces of the series resonators 22 and 23. Lead portions 28c and 29c of the outputs 28 and 29 are cranked in the thickness direction similarly to the lead portions 26b and 27b of the input terminals 26 and 27, and located to be engaged with the grooves 20e of the first case 20 and then drawn outside.

The parallel resonators 24 and 25 are placed on the output terminal plates 28 and 29. These resonators 24 and 25, which are piezoelectric ceramic resonators utilizing spread vibration modes, for example, are smaller in thickness than the series resonators 22 and 23 in order to attain higher parallel equivalent capacity than the capacity of the series resonators 22 and 23. The parallel resonators 24 and 25 are provided with whole face electrodes 24a and 25a on both surfaces. The electrodes 24a and 25a on the lower surfaces of these resonators 24 and 25 are in contact with the upper projections 28a and 29a of the output terminal plates 28 and 29.

The ground terminal plates 30 and 31, which are formed by spring plates, are arcuately bent downwardly. Projections 30a and 31a are formed on central portions of lower surfaces of the terminals 30 and 31, to be in contact with the electrodes 24a and 25a on the upper surfaces of the parallel resonators 24 and 25. Lead portions 30b and 31b are substantially horizontally projected from one side edges of the terminals 30 and 31, and also located to be engaged with the grooves 20e of the first case 20 and then drawn outside.

The second case 21 closes the opening of the first case 20 in such a manner that it presses the upper surface of the ground terminal plates 30 and 31. Thus, the resonators 22–25 and the terminal plates 26–31 are in pressure contact with each other by repulsion of the ground terminal plates 30 and 31, to attain electrical conduction therebetween.

Figure 3:
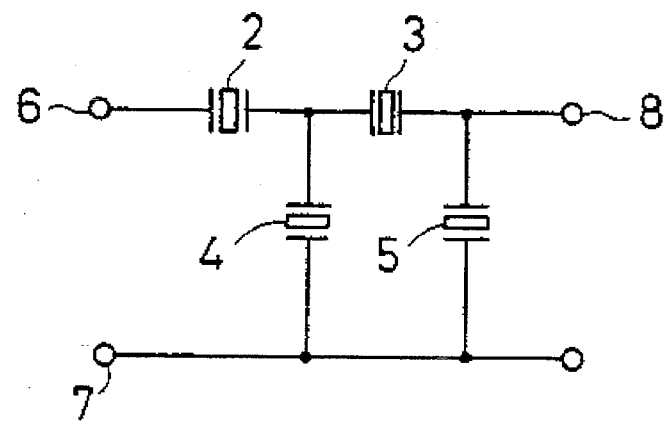
FIG. 3 is a circuit diagram of the filter shown in FIG. 1.
Figure 4:
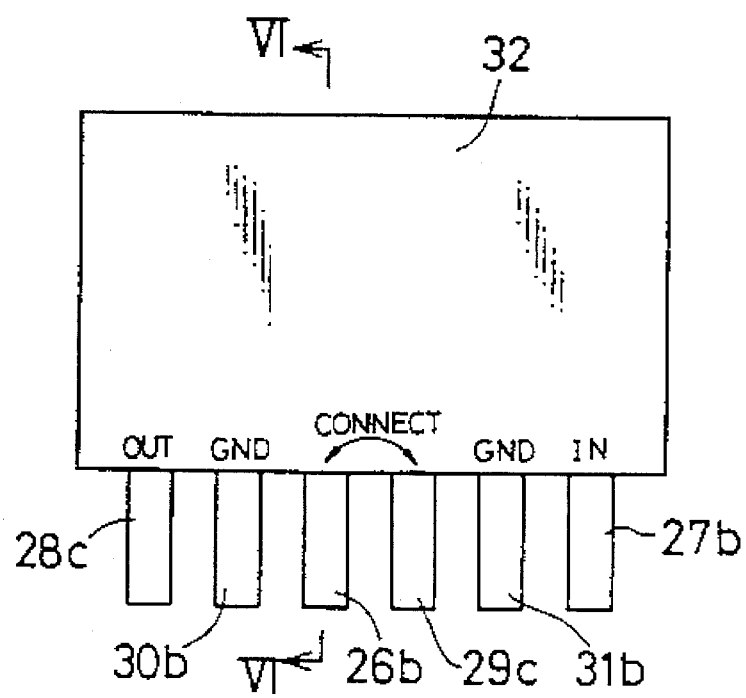
FIG. 4 is a front elevational view showing a piezoelectric component according to a first embodiment of the present invention.
Figure 5:
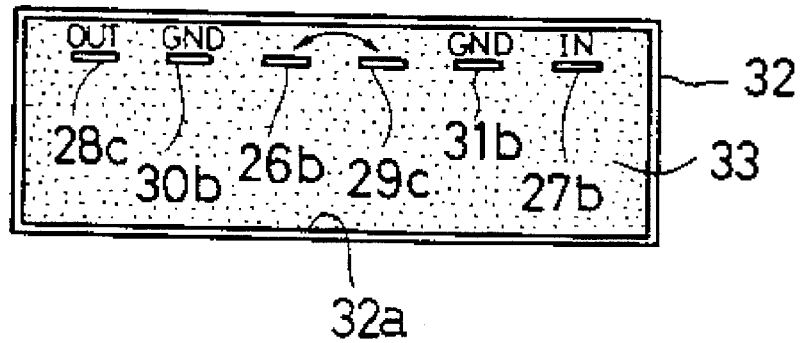
FIG. 5 is a bottom plan view of the piezoelectric component shown in FIG. 4.
Figure 6:
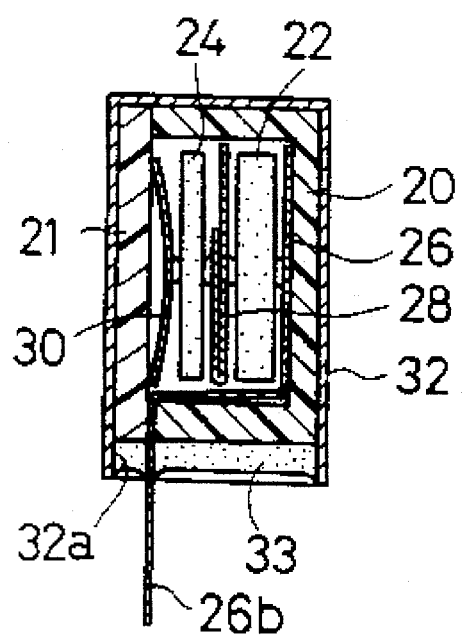
FIG. 6 is a sectional view taken along the line VI—VI in FIG. 4.

The joined first and second cases 20 and 21 are stored in the outer case 32, whose opening portion 32a is sealed with resin 33 (see FIG. 6). In this piezoelectric component, the six lead portions 28c, 30b, 26b, 29c, 31b and 27b are projected from the outer case 32 in this order, as shown in FIG. 4. Since two ladder circuits $L_1$ and $L_2$ of single-section are formed independently at this stage, a ladder type filter is not yet completed. Then, the lead portion 26b of the input terminal plate 26 and the lead portion 29c of the output terminal plate 29 are connected with each other to obtain a ladder type filter whose circuit structure is similar to that shown in FIG. 3. In this case, for the completed filter, the lead portion 27b serves as an input terminal and the lead portion 28c serves as an output terminal, while the lead portions 30b and 31b serve as ground terminals.

Figure 9:
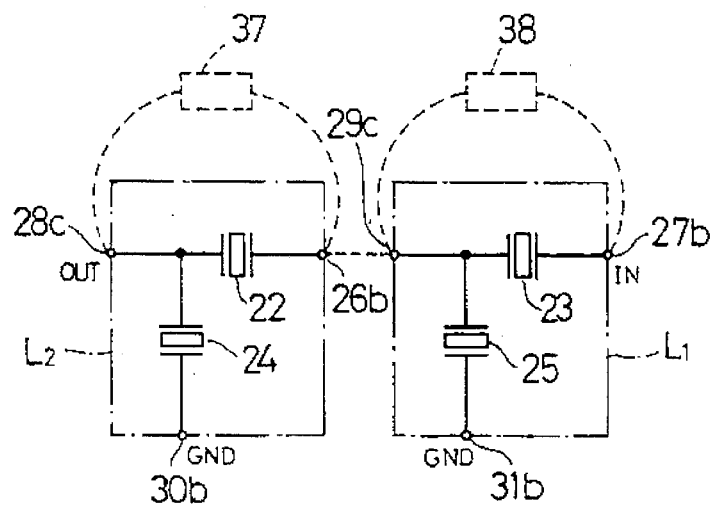
FIG. 9 is a circuit diagram of the piezoelectric component shown in FIG. 4.

As shown in broken lines in FIG. 9, when external elements 37 and 38, such as a capacitor or a resistor, are connected between the lead portions 26b and 28c, and between 27b and 29c, or when the external elements are connected to the ground terminals 30b and 31b, it is possible to change filter characteristics. For example, it is possible to vary the band range when capacitors are connected, while it is possible to carry out waveform damping when resistors are connected.

A method of assembling the aforementioned piezoelectric component is now described.

First, as shown in FIG. 7, the input terminal plates 26 and 27, which are punched from a metal plate being coupled with a strip portion 34 through lead portions 26b and 27b, are placed on the bottom portion of the first case 20, so that the lead portions 26b and 27b are engaged with the grooves 20e of the first case 20. Next, the series resonators 22 and 23 are placed on the input terminal plates 26 and 27 respectively. Then the output terminals 28 and 29, which are punched from a metal plate being coupled with a strip portion 35 through lead portions 28c and 29c, are placed on those resonators 22 and 23, so that the lead portions 28c and 29c are engaged with the grooves 20e of the first case 20. Further, the parallel resonators 24 and 25 are placed on the output terminal plates 28 and 29 respectively. Then the ground terminal plates 30 and 31, which are punched from an elastic metal plate being coupled with a strip portion 36 through lead portions 30b and 31b, are placed on the resonators 24 and 25, so that the lead portions 30b and 31b are engaged with the grooves 20e of the first case 20. The precise location of the input terminal plates 26 and 27, the output terminal plates 28 and 29 and the ground terminal plates 30 and 31 can be readily achieved with respect to the first case 20 by utilizing pilot holes 34a to 36a which are formed in the strip portions 34 to 36.

Thereafter the second case 21 is placed on the ground terminal plates 30 and 31, and pressed to engage the recesses 21a with the hooks 20f of the first case 20. The first and the second cases 20 and 21 may be sealed by a well-known method such as ultrasonic welding. Then the joined cases 20 and 21 are inserted into the outer case 32. At this time, since the depth of this outer case 32 is set to be slightly longer than the shorter edges of the cases 20 and 21, a cavity is defined by the outer side surfaces of the cases 20 and 21 and the opening 32a of the outer case 32. This cavity is filled up with the resin 33, so that the opening 32a of the outer case 32 is completely sealed. Since the first and the second cases are joined as described above, the resin 33 does not flow into these cases 20 and 21.

After such sealing with the resin 33, the strip portions 34 to 36 are cut off from the lead portions which are projected from the opening 32a of the outer case 32, thereby obtaining a four-element piezoelectric component.

Figure 10:
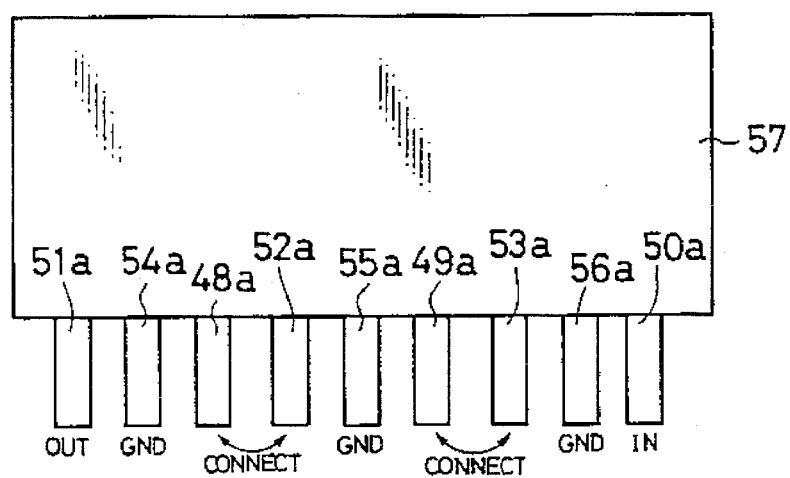
FIG. 10 is a front elevational view showing a piezoelectric component according to a second embodiment of the present invention.
Figure 11:
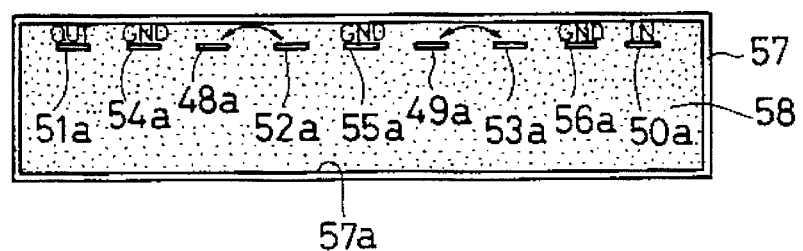
FIG. 11 is a bottom plan view of the piezoelectric component shown in FIG. 10.
Figure 12:
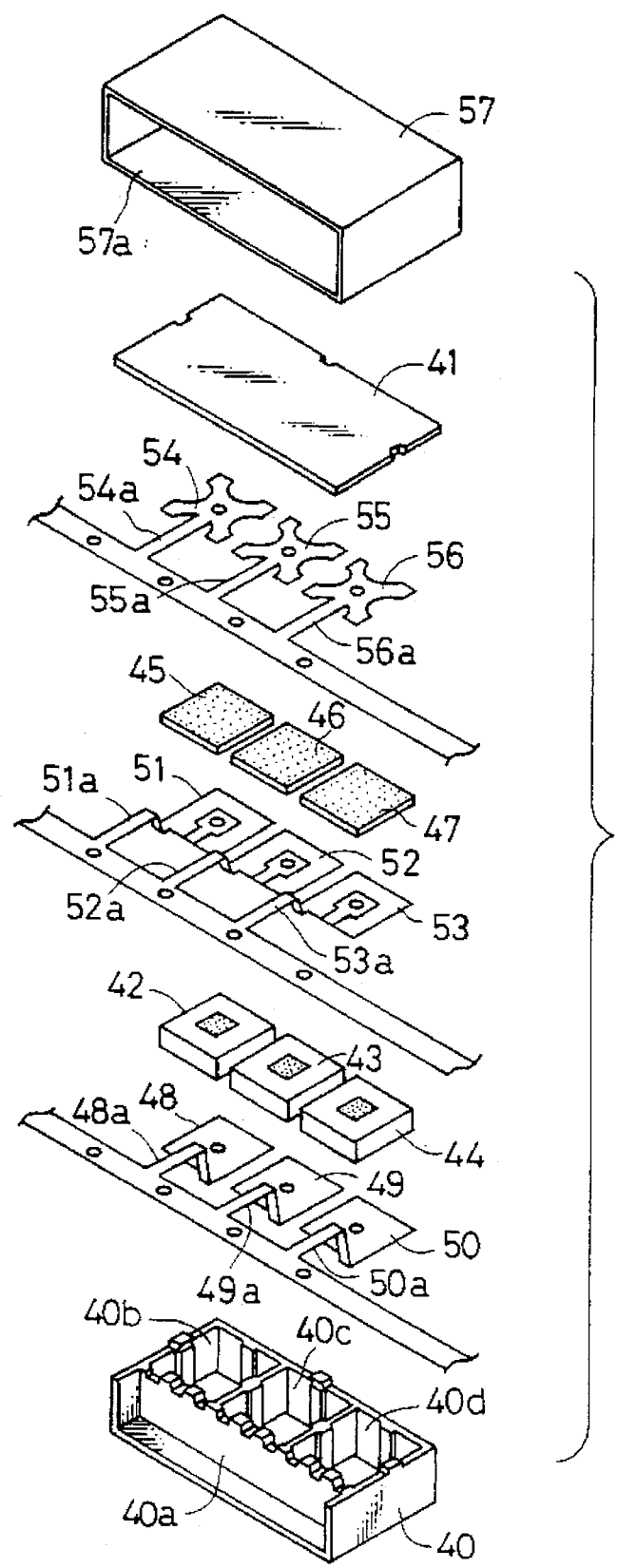
FIG. 12 is an exploded perspective view of the piezoelectric component shown in FIG. 10.

FIGS. 10 to 12 show a piezoelectric component for a six-element (three-section) ladder type filter according to a second embodiment of the present invention.

Between a first and a second cases 40 and 41 of this component, there are stored three series ceramic resonators 42–44 being arranged side by side, three parallel ceramic resonators 45–47, three input terminal plates 48–50, three output terminal plates 51–53 and three ground terminal plates, 54–56. Further, the first and the second cases 40 and 41 are inserted into an outer case 57 and an opening portion 57a of the outer case 57 is sealed with resin 58. Nine lead portions 48a–56a are projected from the opening portion 57a of the outer case 57.

Figure 8:
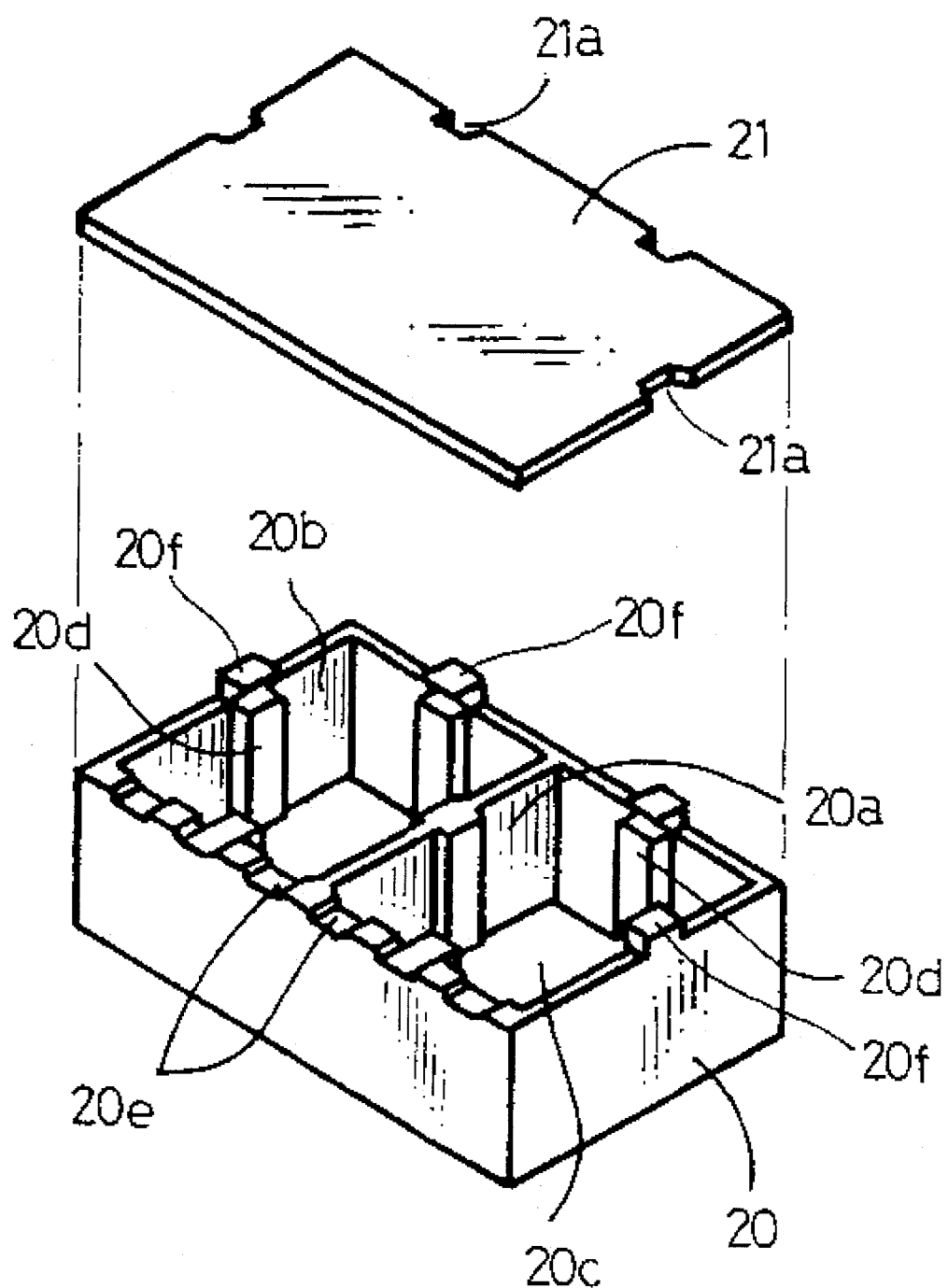
FIG. 8 is an enlarged perspective view of the first and the second cases shown in FIG. 7.

As clearly understood from FIG. 12, the first case 40 is substantially identical in shape to the first case 20 shown in FIG. 8, except that a cavity 40a is formed on a side in which the lead portions are drawn outside and three spaces 40b–40d are formed to receive the parts. Further, the second case 41, being a flat cover to the first case, is also substantially identical in shape to the second case 21 shown in FIG. 8, except that vertical and transverse sizes are larger than those of the case 21.

In addition, the series resonators 42–44, the parallel resonators 45–47, the input terminal plates 48–50, the output terminal plates 51–53 and the ground terminal plates 54–56 are also substantially identical in shape to those shown in FIG. 7, and hence redundant description is omitted.

Figure 13:
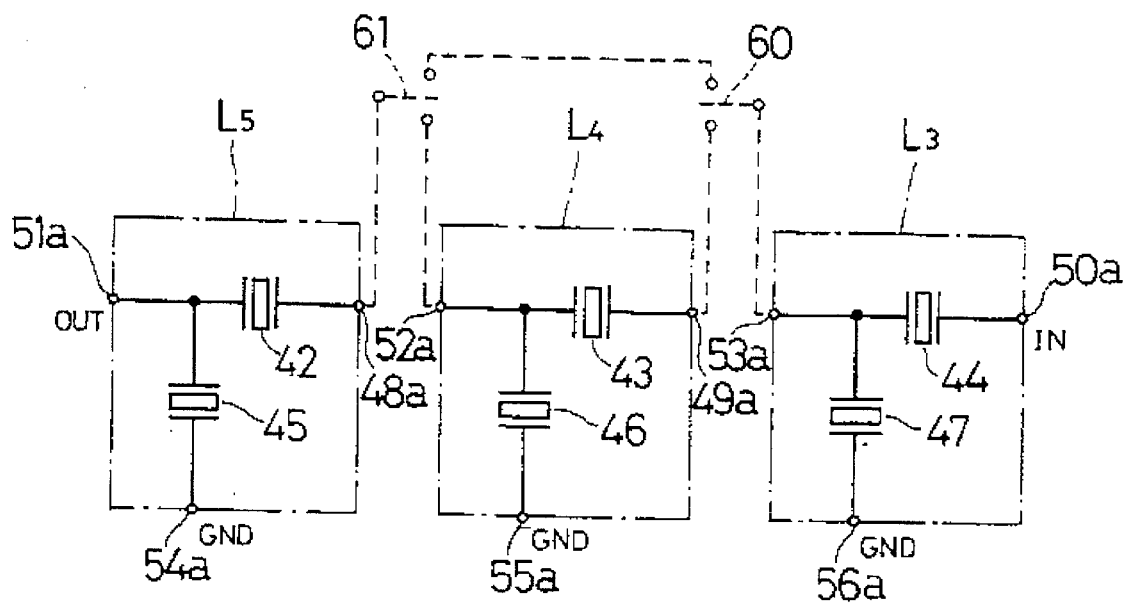
FIG. 13 is a circuit diagram of the piezoelectric component shown in FIG. 10.

As shown in FIG. 13, three ladder circuits $L_3$, $L_4$ and $L_5$ of single-section are arranged in the structure of this embodiment. When the lead portions 48a and 52a, and those 49a and 53a are connected, respectively, a three-section ladder type filter can be obtained. In this case, for this filter, the lead portion 50a serves as an input terminal and the lead portion 51a serves as an output terminal, while the lead portions 54a–56a serve as ground terminals.

As shown by broken lines in FIG. 13, when the ladder circuits $L_3$, $L_4$ and $L_5$ are connected through external switches 60 and 61, it is possible to obtain two alternative types of ladder filters a three-section type filter where the lead portion 48a is connected to 52a and the lead portion 49a is connected to 53a, and a two-section type filter where the lead portion 48a is connected to 53a. As a result, the band range of the filter can be varied readily.

In addition, the outer case may be omitted when the first and second cases are sealed by a well-known method such as ultrasonic welding.

In each of the aforementioned embodiments the input terminal plate, the series resonator, the output terminal plate, the parallel resonator and the ground terminal plate are successively stacked on the first case. However, the piezoelectric component may alternatively be assembled in reverse order to the above. In this case, the terminal plate which is stacked on the uppermost portion is preferably formed of spring plate, in consideration of stability in assembling.

Although the lead portions of the terminal plates are drawn out from a position close to the upper side of the outer case in each of the aforementioned embodiments, the lead portions may alternatively be drawn out from a central portion of the case by partially changing the cranked positions of the lead portions and the structure of the case.

Further, although the ground terminal plate is formed by spring plate, another terminal plate or all terminal plates may alternatively be formed by spring plates. In place of such a method employing terminal plates formed by spring plates, spring plates or plates of rubber such as silicon rubber may be employed independently of those terminal plates.

Furthermore, whereas the embodiments have been described with reference to two-section type and three-section type components, it may be obvious for those skilled in the art that a ladder type filter having single-section section and four or more sections can be formed in a similar manner to the above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric component for a ladder type filter, said piezoelectric component comprising:

a case having a plurality of side walls, a bottom wall and an opening disposed opposite to said bottom wall at an upper portion of said case, said case having at least one partition for dividing its interior into a plurality of spaces arranged side by side, said case having a plurality of grooves located on an upper surface of one of said side walls such that the grooves extend in a direction substantially parallel to said bottom wall;

a plurality of first terminal plates which are each located in one of said spaces and on said bottom wall of said case, each of said first terminal plates having a lead portion engaged with one of said grooves and extending outwardly along a plane that is substantially parallel to said bottom wall;

a plurality of first ceramic resonators which are each located in one of said spaces and on said first terminal plates, each of said first ceramic resonators having electrodes on both major surfaces thereof;

a plurality of second terminal plates which are each located in one of said spaces and on said first ceramic resonators, each of said second terminal plates having a lead portion engaged with one of said grooves and extending outwardly along a plane that is substantially parallel to said bottom wall;

a plurality of second ceramic resonators which are each located in one of said spaces and on said second terminal plates, each of said second ceramic resonators having electrodes on both major surfaces thereof;

a plurality of third terminal plates which are each located in one of said spaces and on said second ceramic resonators, each of said third terminal plates having a lead portion engaged with one of said grooves and extending outwardly along a plane that is substantially parallel to said bottom wall; and a cover closing said opening of said case and being located so as to press said third terminal plates toward said bottom wall of said case and to hold said lead portions of said first terminal plates, said second terminal plates and said third terminal plates in said grooves; wherein said first terminal plates, said first ceramic resonators, said second terminal plates, said second ceramic resonators and said third terminal plates are in pressure contact with each other to form a plurality of single-section circuits.

2. A piezoelectric component in accordance with claim 1, wherein said plurality of side walls includes two long walls and two short walls, said partition is formed to be substantially parallel with said short walls, and said grooves are formed on an upper surface of one of said long walls.

3. A piezoelectric component in accordance with claim 1, wherein said case further comprises a plurality of pillars formed at an interior of each of said spaces, said pillars being arranged within said case so as to locate outer peripheries of said resonators and said terminal plates.

4. A piezoelectric component in accordance with claim 1, wherein at least one of said first terminal plates, said second terminal plates and said third terminal plates are formed by spring plates which are bent in a thickness direction thereof.

5. A piezoelectric component in accordance with claim 1, wherein said first ceramic resonators and said second ceramic resonators are resonators having spread vibration modes.

6. A piezoelectric component in accordance with claim 1, wherein each of said first terminal plates is provided on one major surface thereof with a projection to be in contact with a central portion of each of said first ceramic resonators, each of said second terminals plates is provided on both major surfaces thereof with projections to be in contact with a central portion of each of said first ceramic resonators and a central portion of each of said second ceramic resonators, and each of said third terminal plates is provided on one major surface thereof with a projection to be in contact with a central portion of each of said second ceramic resonators.

7. A piezoelectric component in accordance with claim 1, wherein said case is an inner case, the piezoelectric component further comprising:

an outer case having an interior for receiving said inner case and said cover and having an opening for allowing said lead portions of said first terminal plates, said second terminal plates and said third terminal plates to project outwardly therefrom; and resin being located in said opening of said outer case for sealing said opening.

8. A piezoelectric component in accordance with claim 1, wherein said inner case and said cover are sealed together.

9. A method of manufacturing a piezoelectric component for a ladder type filter which comprises a case, a plurality of first terminal plates, a plurality of first ceramic resonators, a plurality of second terminal plates, a plurality of second ceramic resonators, a plurality of third terminal plates and a cover, said case having four side walls, a bottom wall and an opening disposed opposite to said bottom wall at an upper portion of said case, said case having at least one partition for dividing its interior into a plurality of spaces arranged side by side, and said case having a plurality of grooves formed on an upper surface of one of said side walls, the method comprising the steps of:

simultaneously placing each of said first terminal plates in one of said spaces and on said bottom wall of said case, said first terminal plates being coupled with a strip portion through respective lead portions, said lead portions being inserted into said grooves so as to extend outwardly along a plane that is substantially parallel to said bottom wall;

simultaneously placing each of said first ceramic resonators in one of said spaces and on one of said first terminal plates, each of said first ceramic resonators having electrodes on both major surfaces thereof;

simultaneously placing each of said second terminal plates in one of said spaces and on one of said first ceramic resonators, said second terminal plates being coupled with a strip portion through respective lead portions, said lead portions being inserted into said grooves so as to extend outwardly along a plane that is substantially parallel to said bottom wall;

simultaneously placing each of said second ceramic resonators in one of said spaces and on one of said second terminal plates, each of said second ceramic resonators having electrodes on both major surfaces thereof;

simultaneously placing each of said third terminal plates in one of said spaces and on one of said second ceramic resonators, said third terminal plates being coupled with a strip portion through respective lead portions, said lead portions being inserted into said grooves so as to extend outwardly along a plane that is substantially parallel to said bottom wall;

placing said cover on said case for closing said opening of said case so that said cover presses said third terminal plates toward said bottom wall of said case such that said first terminal plates, said first ceramic resonators, said second terminal plates, said second ceramic resonators and said third terminal plates are in pressure contact with each other to be electrically connected, and so that said case holds said lead portions of said first terminal plates, said second terminal plates and said third terminal plates in said grooves; and cutting each of said strip portions off of said lead portions of said first terminal plates, said second terminal plates and said third terminal plates.

10. A method in accordance with claim 9, further comprising the steps of:

inserting said case and said cover into an outer case so that said lead portions of said first terminal plates, said second terminal plates and said third terminal plates project from an opening in said outer case, and filling said opening of said outer case with resin for sealing said opening in said outer case.

11. A method in accordance with claim 9, further comprising a step of sealing said case and said cover together.

* * * * *